(12) United States Patent
Nicollini et al.

(10) Patent No.: US 6,690,790 B1
(45) Date of Patent: Feb. 10, 2004

(54) RECEIVING SECTION OF A TELEPHONE WITH SUPPRESSION OF INTERFERENCE UPON SWITCHING ON/OFF

(75) Inventors: Germano Nicollini, Piacenza (IT); Sergio Pernici, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/569,113

(22) Filed: May 10, 2000

(30) Foreign Application Priority Data

May 14, 1999 (EP) .............................. 99830296

(51) Int. Cl.$^7$ ............................................... H04M 1/00
(52) U.S. Cl. ............. 379/392.01; 379/392; 379/390.01; 379/388.06; 455/570
(58) Field of Search ....................... 379/399.01, 387.01, 379/387.02, 388.03, 388.05, 388.07, 390.01, 390.03, 392.01, 392, 417, 406.01, 406.05, 388.06, 394, 395, 398; 455/570

(56) References Cited

U.S. PATENT DOCUMENTS

| | | | | |
|---|---|---|---|---|
| 5,029,238 A | * | 7/1991 | Gehr | ........................... 455/222 |
| 5,339,455 A | * | 8/1994 | Vogt et al. | ................... 455/266 |
| 5,890,059 A | * | 3/1999 | Shoemaker et al. | ........ 455/297 |

FOREIGN PATENT DOCUMENTS

| | | |
|---|---|---|
| DE | 2140431 | 2/1973 |
| EP | 0159079 A2 | 10/1985 |
| EP | 0642247 A | 3/1995 |
| JP | 08079338 | 3/1996 |
| WO | WO 91/07814 | 5/1991 |

* cited by examiner

*Primary Examiner*—Rexford Barnie
(74) *Attorney, Agent, or Firm*—Lisa K. Jorgenson; E. Russell Tarleton; Seed IP Law Group PLLC

(57) ABSTRACT

A telephone receiving section having a final stage, an electroacoustic transducer having a first terminal connected to the ground of the circuit, a unit for controlling switching on/off, a source of a reference voltage, a switch that can adopt a first position or a second position in order to connect the second terminal of the transducer selectively, via a capacitor, to a reference-voltage terminal of the reference voltage source or to an output terminal of the final stage, respectively, and control means that respond to signals of the unit for controlling switching on/off in order to activate or to deactivate the final stage and the reference-voltage source and to operate the switch in accordance with a predetermined time program. The receiving section operates with the same immunity to disturbances as a fully balanced structure, even though the transducer is not connected between two balanced outputs.

8 Claims, 1 Drawing Sheet

RECEIVING SECTION OF A TELEPHONE WITH SUPPRESSION OF INTERFERENCE UPON SWITCHING ON/OFF

TECHNICAL FIELD

The present invention relates to a receiving section of a telephone with suppression of interference that is activated and deactiveated by switching on/off or the receiving section.

BACKGROUND OF THE INVENTION

The signal received by a telephone of a digital telephone network is first demodulated and then processed in digital form, is converted into analog form and, finally, is amplified and applied to an electroacoustic transducer.

The receiving section of a telephone can be represented schematically as shown in FIG. 1. A demodulated digital signal RX-IN produced by a receiving and demodulation unit 10 is applied to the input of a circuit unit 11 in which it is converted into analog form and filtered and its voltage is amplified. The analog signal output from the unit 11 is applied to the input of a power amplifier 12, which can transfer the signal to an electroacoustic transducer 13 such as an electromagnetic unit or loudspeaker with sufficient electrical power for the operation thereof. The gain of the power amplifier 12 is determined by the ratio between the resistance of a feedback resistor R2 connected between the inverting input and the output of the amplifier and the resistance of a resistor R1 connected between the output of the unit 11 and the inverting input of the amplifier.

To prevent power dissipation when the telephone is not in use, circuit means which respond to an external activation or deactivation control are provided both in the unit 11 and in the amplifier 12. This function is represented by the connections of the unit 11 and of the amplifier 12 to a terminal to which a single-bit digital signal PD (power down) can be applied. By convention, the signal PD=1 corresponds to a zero current-absorption state and the signal PD=0 permits absorption of current from the supply (power up).

As is known, each time there is a change from the "power down" state to the "power up" state or vice versa, both the signal-processing unit and the power amplifier are subject to an abrupt voltage and current transition before reaching the steady operating state. During this transition, electrical disturbances with frequency components in the acoustic band are produced and are translated into audible and annoying noises in the electroacoustic transducer.

To prevent these problems, various measures that provide for the connection of active and passive components in series and/or in parallel with the transducer have been adopted to filter out the undesired electrical disturbances. However, a solution of this type requires fairly bulky components outside the power amplifier, which is normally in the form of an integrated circuit.

It has also been proposed to use processing units and amplification units with balanced inputs and outputs in order to cancel out at least some of the possible disturbances, particularly so-called common-mode disturbances. However, according to the prior art, the use of balanced amplification units was considered advantageous only when the electroacoustic transducer could be connected between the two balanced outputs. When this was not possible because one of the terminals of the transducer had to be connected to a fixed power terminal, for example to the ground of the circuit, it was not possible to make use of the intrinsic advantage of the balanced amplifier.

SUMMARY OF THE INVENTION

In accordance with one disclosed embodiment of the present invention a receiving section for a telephone is provided that has a final stage and an electroacoustic transducer having one of its terminals connected to the ground terminal, and which is free of the above-described disturbances and does not require filtering components.

In accordance with another disclosed embodiment of the present invention, a receiving section of a telephone is provided, including a final stage; an electroacoustic transducer having a first terminal connected to a ground terminal of the receiving section; a unit for controlling switching on/off; a voltage source having a reference voltage terminal; a switch having a first position and a second position in order to connect a second terminal of the transducer selectively via a capacitor to the reference-voltage terminal or to an output terminal of the final stage, respectively; and a controller that responds to signals from the unit for controlling switching on/off in order to activate or deactivate the final stage, the reference voltage source, and the switch in accordance with a predetermined time program.

BRIEF DESCRIPTION OF THE DRAWINGS

The invention will be understood further from the following detailed description of a non-limiting embodiment thereof given with reference to the appended drawings, in which.

DETAILED DESCRIPTION OF THE INVENTION

Figure 1:
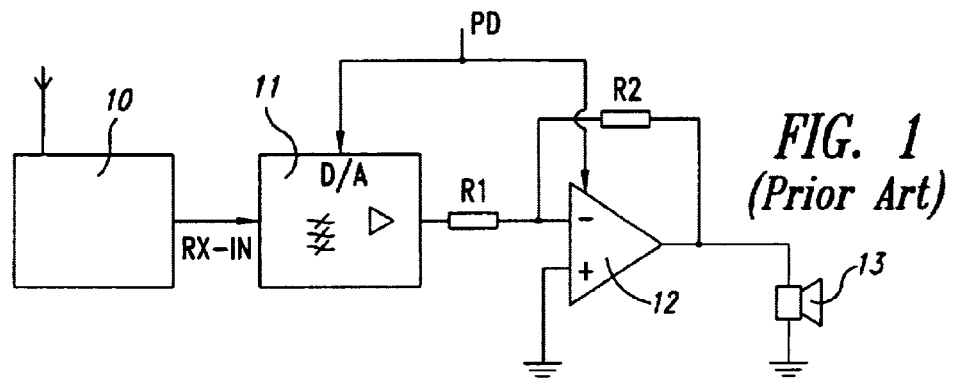
FIG. 1 is a block diagram of a generic receiving section of a telephone.
Figure 2:
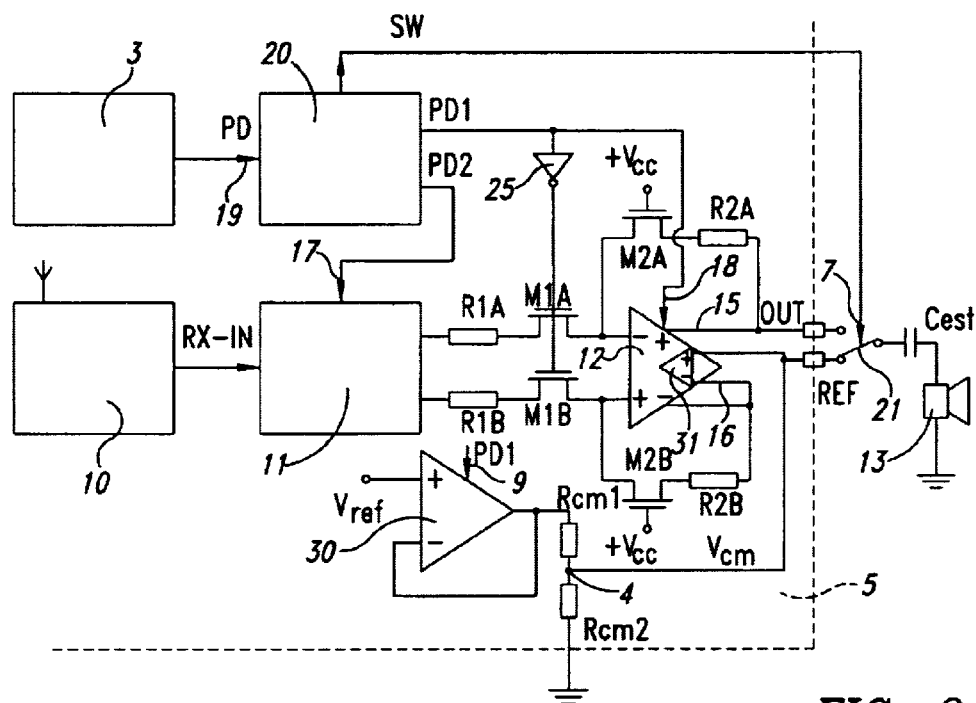
FIG. 2 is a block diagram showing an embodiment of the invention.

With reference to FIG. 2, in which elements identical or corresponding to those of FIG. 1 are indicated by the same reference numerals, a processing unit 11 with a balanced structure receives a demodulated digital signal RX-IN as an input and supplies a balanced analog signal at two outputs. The outputs of the unit 11 are connected to the inputs of a final power stage constituted by a balanced differential amplifier or fully differential amplifier 12; more particularly, each output is connected to one of the inputs of the amplifier 12 via a respective resistor R1A and R1B in series with a respective n-channel MOSFET transistor M1A and M1B having the function of an electronic switch. The differential outputs 15 and 16 of the amplifier 12 are connected in a feedback arrangement to its inverting and non-inverting inputs, respectively, via respective resistors R2A, R2B each in series with a MOSFET transistor M2A, M2B biased for conduction.

In the embodiment shown, the circuit units 10, 11 and 12 and the connection elements between them form parts of a monolithic integrated circuit, generally indicated 5.

One output, indicated 15, of the amplifier 12 is connected to a terminal OUT of the integrated circuit 5. A switch 21 outside the integrated circuit and constituted, for example, by two MOSFET transistors, can connect an electroacoustic transducer 13 to the terminal OUT or to another terminal of the integrated circuit, indicated REF, by means of a de-coupling capacitor Cest. The switch 21 has a control terminal 7 connected to a control unit 20 also included in the integrated circuit 5. The terminal REF is connected to the intermediate tap of a voltage divider formed by two resistors Rcm1 and Rcm2 connected between the output of an operational amplifier 30 and the ground terminal of the integrated circuit. The operational amplifier 30 has its inverting terminal connected to its output and its non-inverting terminal connected to a generator (not shown) of a reference voltage Vref. The terminal REF is also connected to the non-inverting input of an operational amplifier 31 having its inverting input connected to the other output 16 of the differential amplifier 12. The amplifier 31 represents a common-mode feedback circuit which is normally provided in a balanced amplifier for controlling the common-mode reference voltage of the output signal.

The processing unit 11 and the differential amplifier 12 are supplied by a voltage supply Vcc, not shown, and each has circuit means which enable or disable its supply in dependence on a signal applied to a respective activation terminal 17 or 18.

The control unit 20 has an input terminal 19 which receives a binary signal PD (power down), generated by a central control unit 3 of the telephone circuits which, amongst other things, controls the on/off state of the circuits of the receiving section. The control unit 20 responds to the signal PD producing, in accordance with a predetermined time program, the signal SW for controlling the switch 21 and two activation/deactivation signals PD1 and PD2 at the activation terminals 17 and 18 of the processing unit 11 and of the amplification unit 12, respectively. The signal PD1 is also applied to an activation/deactivation terminal 9 of the operational amplifier 30 and, via an inverter 25, to the gate terminals of the n-channel MOSFET transistors M1A and M1B. (The inverter 25 is necessary because the n-channel transistors M1A and M1B have to be closed when the amplifier 12 is activated; since this takes place when the binary signal PD1 is at low level (PD1=0), this signal has to be inverted in order to have the positive voltage necessary to control the n-channel transistors M1A and M1B; if p-channel transistors were used instead of n-channel transistors, the inverter would not be necessary).

The resistors R1A, R1B and R2A, R2B serve to determine the gain of the amplifier 12. The function of the transistors M2A and M2B, which are biased for conduction, is purely to introduce an additional resistance equal to that of the conductive transistors M1A and M1B into the feedback circuit for determining the gain. The gain of the amplifier is determined by the ratio between the feedback resistance and the resistance in series with the input terminal. As is known, during the design of an integrated circuit, it is not possible accurately to predict the resistance of a single resistor because of the great variability of the manufacturing parameters, but it is possible to produce two resistors with a precise ratio between their resistances. The connection of a transistor (M1A, M1B) having a given resistance when conductive in series with each of the inputs modifies the ratio set at the design stage between the feedback resistance and the resistance in series with the inputs. The resistance of each of the conductive transistors M2A and M2B in series with the feedback resistors compensates for the modification of this ratio.

The operation of the circuit will now be considered. If the signal PD is changing from 1 to 0, that is, from a switched-off state to a switched-on state (power up) the control unit 20 produces a signal PD2=0. The processing unit 11 is activated by this signal at the activation/ deactivation terminal 17. After a predetermined delay, the control unit 20 produces a signal PD1=0 which is applied to the activation/deactivation terminal 18 of the amplification unit 12. The delay selected is long enough to allow the processing unit 11 to settle down; the disturbances present at the output of the unit 11 thus have no effect on the amplifier 12 or on the electroacoustic transducer 13 because the amplifier is switched off and the transistors M1A and M1B behave as open circuits whilst the unit 11 is settling down. Simultaneously with the activation of the amplifier 12, the outputs of the unit 11 are connected to the inputs of the amplifier 12 via the conductive MOSFET transistors M1A and M1B. Given that the input signal of the differential amplifier 12 is stable, only common-mode interference due to the settling-down of the amplifier itself can be present at the outputs 15 and 16 of the amplifier.

As already mentioned at the beginning, the common-mode disturbances would be cancelled out if the electroacoustic transducer could be connected between the two output terminals of the balanced amplifier. If, however, it has to be connected between one of the outputs and the ground, according to the prior art, the disturbances present at the output can only be eliminated by suitable filters. In contrast, the invention enables the disturbances to be eliminated even though the transducer is connected between one of the outputs and ground. This can be seen by considering the operation of the final stage of the receiver portion according to the embodiment of the invention shown in FIG. 2.

During the power-down stage, that is, when PD=1 and PD1=1, the amplification unit 12 and the operational amplifier 30 are inactive and, although their outputs have a high impedance towards the ground of the circuit, they are substantially at the ground potential. The timing of the signals determined by the control unit 20 is such that, in this situation, the switch 21 is in the position shown in FIG. 2, so that the capacitor Cest is connected to the intermediate tap 4 of the divider Rcm1, Rcm2 and is therefore discharged.

Figure 3:
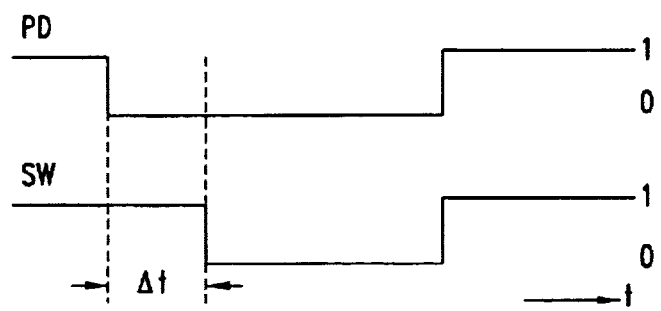
FIG. 3 is a graph showing the time relationship between the two control signals of the circuit of FIG. 2.

Upon a change from the power-down state to the power-up state, that is, from PD=1 to PD=0, the switch 21 is switched, with a predetermined delay, to the position in which the capacitor Cest is connected to the terminal OUT, that is, to the output 15 of the amplification unit 12. The relationship between the signal PD and the signal SW is shown in the graph of FIG. 3 in which $\Delta t$ indicates the switching delay. During the period $\Delta t$ in which the unit 12 and the operational amplifier are switched on, the voltage at the intermediate tap 4 of the divider rises from 0 (ground potential) to a value Vcm determined by the input voltage Vref, with a time constant $\tau 1 = Rp \cdot Cest$ in which Rp is the resistance of the resistors Rcm1 and Rcm2 in parallel and Cest is the capacitance of the capacitor indicated by the same symbol. The resistors and the capacitor, as well as the supply voltage Vcc and the reference voltage Vref are selected in a manner such that the following equation is true:

$$Vcm = Vref \cdot Rcm2/(Rcm1 + Rcm2) = Vcc/2$$

Typical values for this embodiment are Vcc=2.7V, Vref=2.3V, Rcm1=22 Kohm, Rcm2=32 Kohm, so that Vcm=1.36V, Cest=10 $\mu$F and $\tau 1$=130 ms.

In these conditions, the voltage at the output 15 at rest is equal to Vcm (the common-mode reference voltage value) owing to the effect of the common-mode feedback circuit. The selection of the values is not critical since the voltage value at rest may also be offset from the half of the supply voltage Vcc, this value being selected purely to ensure maximum output volume-range. With regard to the time constant, it suffices for this to be greater than a minimum value, for example of 100 ms, which ensures the absence of acoustic-band frequencies in the capacitor-charging transient. The delay Δt selected for the switching of the switch 21 (SW from 1 to 0) is quite long to ensure that the capacitor Cest is charged to the voltage Vcm, for example, Δt=1s. Owing to the effect of the common-mode feedback circuit, in the absence of an input signal to the unit 12, the voltage at the terminal OUT increases at the same rate as the voltage in the capacitor Cest. Only after the voltage at the output terminal OUT has reached its rest value Vcm, that is after about 1s, does the control signal SW change from 1 and 0 and bring about switching of the switch so as to put the output terminal OUT into communication with the capacitor Cest. Since the capacitor Cest is already charged to a voltage equal to the voltage Vcm which is the voltage at the output 15 of the amplifier 12 at rest, the amplified voice signal can be transferred to the electroacoustic transducer 13 in a linear manner, that is, without the superimposition of acoustic-band components extraneous to the signal.

Upon a change from the power-up state (PD=0) to the power-down state (PD=1), the control unit 20 generates a signal SW=1 which brings about immediate switching of the switch 21 which thus returns to the position shown in FIG. 2. The capacitor Cest is discharged through the resistor Rcm2 with a time constant τ2=Rcm2·Cest, greater than the charging time constant, enabling the capacitor Cest to be discharged without high-frequency transients.

To summarize, any disturbances present between the outputs 15 and 16 of the amplifier 12 due to the settling-down of the voltages and of the currents when the amplifier is activated or deactivated have no effect on the transducer 13 because they occur when the transducer is not connected to the output OUT. Moreover, during the activation/deactivation of the amplifier 12, the coupling capacitor Cest is charged/discharged gradually and thus without creating voltage or current variations such as to generate audible noise in the transducer 13.

A receiver portion which operates with the same immunity to disturbances as a fully balanced structure even though the electroacoustic transducer is not connected between two balanced outputs is thus produced.

Although only one embodiment of the invention has been described and illustrated, clearly many variations and modifications are possible within the scope of the same inventive concept. Thus, the invention is to be limited only by the claims that follow and the equivalents thereof.

What is claimed is:

1. A receiving section of a telephone, comprising:
   a final stage and an electroacoustic transducer having a first terminal connected to a ground terminal of the receiving section;
   a unit for controlling switching on/off,
   a voltage source having a reference voltage terminal,
   switching means that can adopt a first position or a second position in order to connect a second terminal of the electroacoustic transducer selectively, via capacitive means, to the reference-voltage terminal or to an output terminal of the final stage, respectively; and
   control means that respond to signals of the unit for controlling switching on/off in order to activate or to deactivate the final stage and the reference voltage source and to operate the switching means in accordance with a predetermined time program.

2. The receiving section of claim 1, wherein the predetermined time program provides for the substantially simultaneous activation of the final stage and of the reference-voltage source and, with a predetermined delay, for the switching of the switching means from the first position to the second position.

3. The receiving section of claim 2, wherein the predetermined time program provides substantially simultaneously for the deactivation of the final stage and of the reference-voltage source and for the switching of the switching means from the second position to the first position.

4. The receiving section of claim 1 wherein the final stage comprises a differential amplifier with balanced outputs with a common-mode regulation circuit, in which the output terminal of the final stage is one of the balanced outputs of the differential amplifier, and in which the reference-voltage terminal of the voltage source is connected to the common-mode regulation circuit.

5. The receiving section of claim 4, wherein the common-mode regulation circuit comprises an operational amplifier having a first terminal connected to the other of the balanced outputs of the differential amplifier and a second input terminal connected to the reference-voltage terminal.

6. The receiving section of claim 5, wherein the voltage source comprises resistive means between its reference-voltage terminal and the ground terminal.

7. The receiving section of claim 6, wherein the voltage source comprises an operational amplifier having its output connected to the resistive means via further resistive means, its inverting input connected to its output, and its non-inverting input connected to a constant reference source, and in which the control means respond to signals of the unit for controlling switching on/off in order to activate or deactivate the operational amplifier in accordance with the predetermined time program.

8. The receiving section of claim 7, wherein the time program provides for the substantially simultaneous activation of the final stage and of the operational amplifier.

* * * * *